United States Patent
Cordero et al.

(10) Patent No.: US 7,793,143 B2
(45) Date of Patent: *Sep. 7, 2010

(54) SWITCHING A DEFECTIVE SIGNAL LINE WITH A SPARE SIGNAL LINE WITHOUT SHUTTING DOWN THE COMPUTER SYSTEM

(75) Inventors: Edgar R. Cordero, Round Rock, TX (US); James S. Fields, Jr., Austin, TX (US); Kevin C. Gower, LaGrangeville, NY (US); Eric E. Retter, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 118 days.

This patent is subject to a terminal disclaimer.

(21) Appl. No.: 12/098,294

(22) Filed: Apr. 4, 2008

(65) Prior Publication Data
US 2008/0215929 A1  Sep. 4, 2008

Related U.S. Application Data

(63) Continuation of application No. 11/056,886, filed on Feb. 11, 2005, now Pat. No. 7,380,161.

(51) Int. Cl.
G06F 11/00 (2006.01)
(52) U.S. Cl. .......................................... 714/5
(58) Field of Classification Search ................ 714/5
See application file for complete search history.

(56) References Cited

U.S. PATENT DOCUMENTS

| | | | |
|---|---|---|---|
| 4,890,224 A | 12/1989 | Fremont | 710/11 |
| 5,498,886 A | 3/1996 | Hsu et al. | 257/213 |
| 5,659,678 A | 8/1997 | Aichelmann et al. | 714/25 |
| 5,737,199 A | 4/1998 | Kanamori et al. | 363/56 |
| 6,067,594 A | 5/2000 | Perino et al. | 710/301 |
| 6,357,018 B1 | 3/2002 | Stuewe et al. | 714/37 |
| 6,381,708 B1 | 4/2002 | Larsen et al. | 714/8 |
| 6,636,943 B1 | 10/2003 | Stancil | 711/115 |
| 2002/0054518 A1 | 5/2002 | Ooishi et al. | 365/200 |
| 2003/0051091 A1 | 3/2003 | Leung et al. | 711/101 |
| 2003/0072185 A1 | 4/2003 | Lane et al. | 365/189.02 |
| 2003/0163767 A1 | 8/2003 | Phelps | 714/42 |
| 2005/0180521 A1 | 8/2005 | Hsu et al. | 375/295 |
| 2007/0008772 A1 | 1/2007 | Hidaka | 365/158 |
| 2007/0014172 A1 | 1/2007 | Hidaka | 365/210 |
| 2007/0174718 A1 | 7/2007 | Fouquet-Lapar | 714/42 |
| 2008/0016401 A1 | 1/2008 | Jeddeloh | 714/42 |

*Primary Examiner*—Bryce P Bonzo
(74) *Attorney, Agent, or Firm*—Hamilton & Terrile, LLP; Stephen A. Terrile

(57) ABSTRACT

A method, computer program product and system for switching a defective signal line with a spare signal line without shutting down the computer system. A service processor monitors error correction code (ECC) check units configured to detect an error in a signal line. If an ECC check unit detects an error rate that exceeds a threshold, then the signal line with such an error rate may be said to be "defective." The service processor configures switch control units in the driver/receiver pair associated with the defective signal line to be able to switch the defective signal line with a spare line upon receipt of a command from a memory controller switch control unit. In this manner, the system is not deactivated in order to switch a defective signal line with a spare line thereby reducing the time that the processor cannot send information to the memory buffers.

9 Claims, 4 Drawing Sheets

SWITCHING A DEFECTIVE SIGNAL LINE WITH A SPARE SIGNAL LINE WITHOUT SHUTTING DOWN THE COMPUTER SYSTEM

CROSS REFERENCE TO RELATED APPLICATIONS

The present application is a continuation application of U.S. patent application Ser. No. 11/056,886, which was filed on Feb. 11, 2005 now U.S. Pat. No. 7,380,161, which is assigned to the assignee of the present invention. The present application claims priority benefits to U.S. patent application Ser. No. 11/056,886.

TECHNICAL FIELD

The present invention relates to the field of a transfer of data in a data processing system, and more particularly to switching a defective signal line with a spare signal line without shutting down the computer system.

BACKGROUND INFORMATION

A computer system may include multiple processors where each processor includes a component, commonly referred to as a memory controller, configured to control the issuance of read or write commands by the processor to a system memory. A read command may refer to a request to read data at a particular address location in system memory. A write command may refer to a request to write data, provided by the processor, to a particular address location in system memory.

Each processor may be coupled to the system memory through a series of memory buffers chained to one another. These memory buffers are required as the data rate at which the commands (read and write commands) and data are transmitted by the processor is greater than the rate at which the system memory is accessed. Each memory buffer may be associated with particular banks of memory in the system memory. Each memory buffer is configured to store the read and write commands, along with any data, received from a processor that are directed to its associated banks of memory in the system memory.

The interconnections between a processor and the first memory buffer in the series of chained memory buffers as well as between the memory buffers themselves are referred to herein as "signal lines". Data, such as read and write commands described above, may be transmitted from the processor to the appropriate memory buffer (including being transmitted amongst the chained memory buffers to reach the appropriate memory buffer) through these signal lines. These interconnections may also include what is referred to herein as a "spare line" or a "spare signal line". The spare line may be used to replace a signal line that has become defective thereby ensuring the correct transfer of data.

When a signal line is detected as being defective, the defective signal line is replaced with the spare line by deactivating, i.e., turning off, the computer system. Once the computer system is deactivated, the defective signal line is replaced with the spare signal line. However, by requiring to deactivate the computer system, a significant amount of time (time that the computer system is deactivated plus the time to replace the defective signal line with the spare signal line plus the time to reactivate the computer system) elapses before data can be resent from the processor to the memory buffers. If the computer system did not have to be deactivated in order to switch the defective signal line with the spare signal line, then the time that the processor could not send information to the memory buffers would be greatly reduced.

Therefore, there is a need in the art to switch a defective signal line with a spare signal line without shutting down the computer system.

SUMMARY

The problems outlined above may at least in part be solved in some embodiments by monitoring error correction code (ECC) check units configured to detect an error in a signal line. ECC check units may be located in the processor and in the memory buffers. If an ECC check unit detects an error rate that exceeds a threshold, then the signal line with such an error rate may be said to be "defective." A processor, referred to herein as the service processor, configures the switch control units in the driver/receiver pair associated with the defective signal line. These switch control units may be configured to control the switches that receive and transmit the data for the defective signal line. The configuration performed by the service processor may involve identifying the signal line that is defective and the spare line that is to replace the defective signal line. A unit within the memory controller of the processor, a memory controller switch control unit, may be configured to halt the transfers between the memory controller and to and from a driver/receiver, respectively, in the processor upon receiving an indication from the service processor to start the process in switching the defective signal line with the spare line. After halting the transfers, the memory controller switch control unit issues a command to the switch control units in the driver/receiver pair associated with the defective signal line to execute the switching of the defective signal line with the spare line. After a delay to allow the switching to occur, the memory controller switch control unit resumes the transfers between the memory controller and to and from a driver/receiver, respectively, in the processor. In this manner, the system is not deactivated in order to switch a defective signal line with a spare line thereby reducing the time that the processor cannot send information to the memory buffers.

In one embodiment of the present invention, a method for switching a defective signal line with a spare signal line without shutting down a computer system may comprise the step of monitoring outputs of units configured to determine if a signal line is in error. The method may further comprise detecting a defective signal line if the defective signal line has an error rate that exceeds a threshold. The method may further comprise configuring switch control units in a driver/receiver pair associated with the defective signal line to execute a switch of the defective signal line with an indicated spare signal line. The switch control units are configured to control switch units configured to determine which signal line to transmit and receive incoming data.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
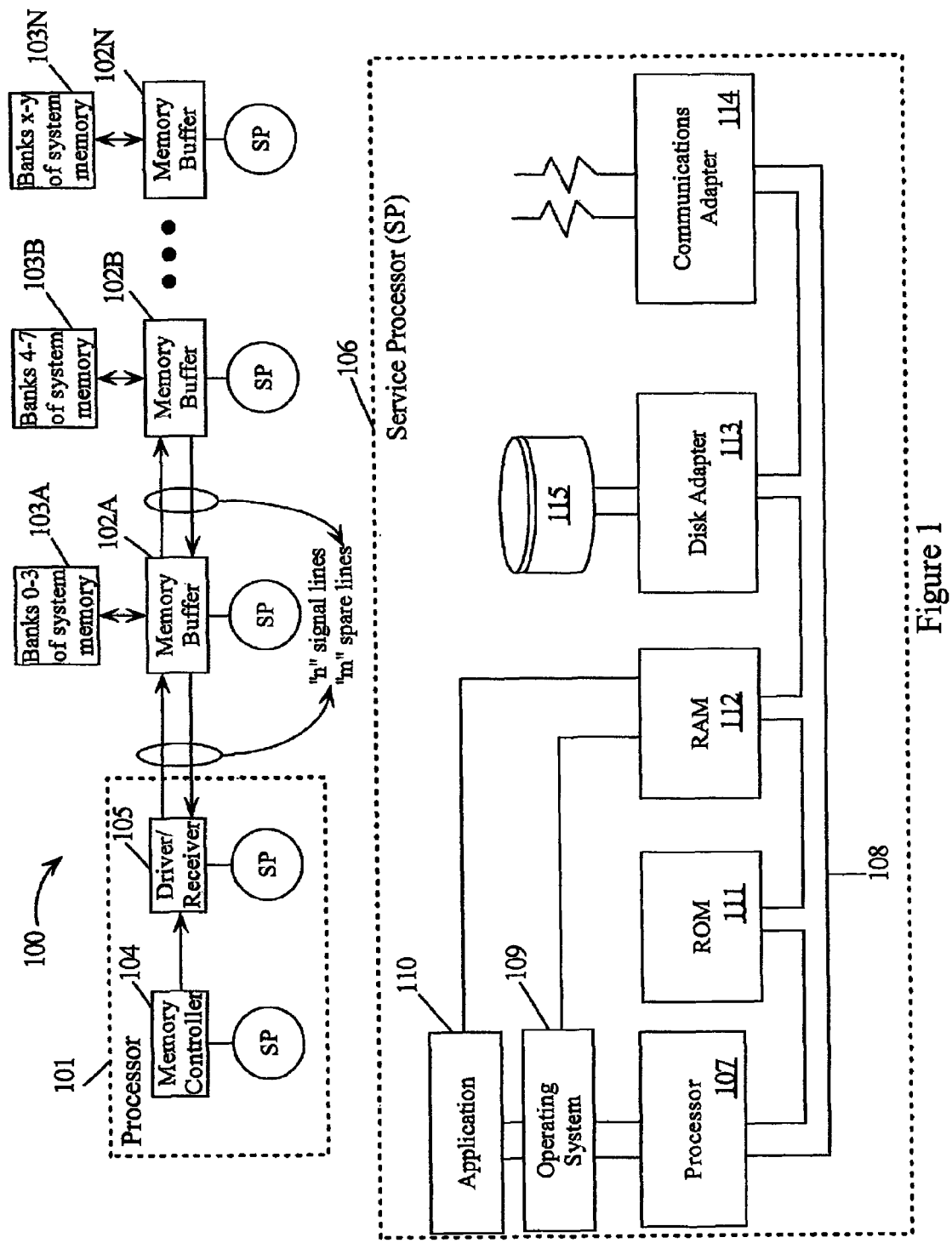
FIG. 1 illustrates a system in accordance with an embodiment of the present invention.

The present invention comprises a method, computer program product and system for switching a defective signal line with a spare signal line without shutting down a computer system. In one embodiment of the present invention, a processor, referred to herein as the "service processor", is configured to monitor error correction code (ECC) check units configured to detect an error in a signal line. These ECC check units may be located in the processor and in the memory buffers. If an ECC check unit detects an error rate that exceeds a threshold, then the signal line with such an error rate may be said to be "defective." The service processor configures the switch control units in the driver/receiver pair associated with the defective signal line. These switch control units may be configured to control the switches that receive and transmit the data for the defective signal line. The configuration performed by the service processor may involve identifying the signal line that is defective and the spare line that is to replace the defective signal line. A unit within the memory controller of the processor, a memory controller switch control unit, may be configured to halt the transfers between the memory controller and to and from a driver/receiver, respectively, in the processor upon receiving an indication from the service processor to start the process in switching the defective signal line with the spare line. After halting the transfers, the memory controller switch control unit issues a command to the switch control units in the driver/receiver pair associated with the defective signal line to execute the switching of the defective signal line with the spare line. After a delay to allow the switching to occur, the memory controller switch control unit resumes the transfers between the memory controller and to and from a driver/receiver, respectively, in the processor. In this manner, the system is not deactivated in order to switch a defective signal line with a spare line thereby reducing the time that the processor cannot send information to the memory buffers.

It is noted that the principles of the present invention described herein may be applied to any bus interface where the bus interface includes multiple signal lines and one or more spare lines. It is further noted that embodiments applying the principles of the present invention to such bus interfaces would fall within the scope of the present invention.

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

FIG. 1—Computer System

FIG. 1 illustrates an embodiment of the present invention of a computer system 100. Computer system 100 may include a processor 101 coupled to memory buffers 102A-N, where N may be any number. Memory buffers 102A-N may collectively or individually be referred to as memory buffers 102 or memory buffer 102, respectively. In one embodiment, each memory buffer 102 may reside on the same printed circuit board as processor 101. In another embodiment, each memory buffer 102 may be an integrated circuit residing on a memory Dual In-Line Memory Module (DIMM). Processor 101 may be coupled to memory buffers 102 via "n" signal lines and "m" spare lines, where "n" and "m" may be any number. Further, memory buffers 102 may be coupled to one another in a chain-like fashion via "n" signal lines and "m" spare lines.

Each memory buffer 102 may be coupled to particular sets of banks 103A-N in system memory (not shown), where N may be any number. For example, set of banks 103A corresponds to banks 0-3 in system memory; set of banks 103B corresponds to banks 4-7 in system memory and so forth. Hence, for example, memory buffer 102A is coupled to banks 0-3 of system memory, memory buffer 102B is coupled to banks 4-7 of system memory and memory buffer 102N may be coupled to banks X-Y of system memory, where y is the maximum number of banks in system memory and x is the third bank from y (y−3). It is noted that system memory may include any number of banks. It is further noted that each memory buffer 102 may be associated with any number of banks and that associating each memory buffer 102 with four banks of system memory is illustrative.

Referring to FIG. 1, processor 101 may include a memory controller 104 configured to control the issuance of read/write commands from processor 101 to the system memory (not shown) via memory buffer(s) 102. A read command may refer to a request to read data at a particular address location in system memory. A write command may refer to a request to write data, provided by processor 101, to a particular address location in system memory.

Processor 101 may further include a driver/receiver circuit 105 configured to "drive" or transmit a signal, such as a read/write command or data to be written to system memory, onto a set of "n" signal lines and "m" spare lines to memory buffer 102A. Driver/receiver circuit 105 is further configured to "receive" a signal, such as the data requested to be read, transmitted from memory buffer 102A. For example, processor 101 may issue a read command to read the data from a particular address stored in banks 4-7 of system memory. The request is transmitted by driver/receiver circuit 105 onto a set of "n" signal lines and "m" spare lines to memory buffer 102A. If the requested address lies within its associated banks, banks 0-3 in this example, then memory buffer 102A forwards the request to be executed, i.e., forwards the request to read the requested data in those banks of system memory. If, however, the requested address does not lie within its associated banks, banks 0-3 in this example, then memory buffer 102A forwards the request to the next memory buffer 102B onto a set of "n" signal lines and "m" spare lines to memory buffer 102B. Memory buffer 102B performs the same process as memory buffer 102A described above.

Memory controller 104, driver/receiver 105, memory buffers 102 are each monitored by what is referred to herein as a "service processor 106 (SP)". A more detail description of the type of monitoring performed by service processor 106 and the switching of a defective signal line with a spare signal line without shutting down system 100 using service processor 106 is described further below in association with FIGS. 2-4.

Figure 2:
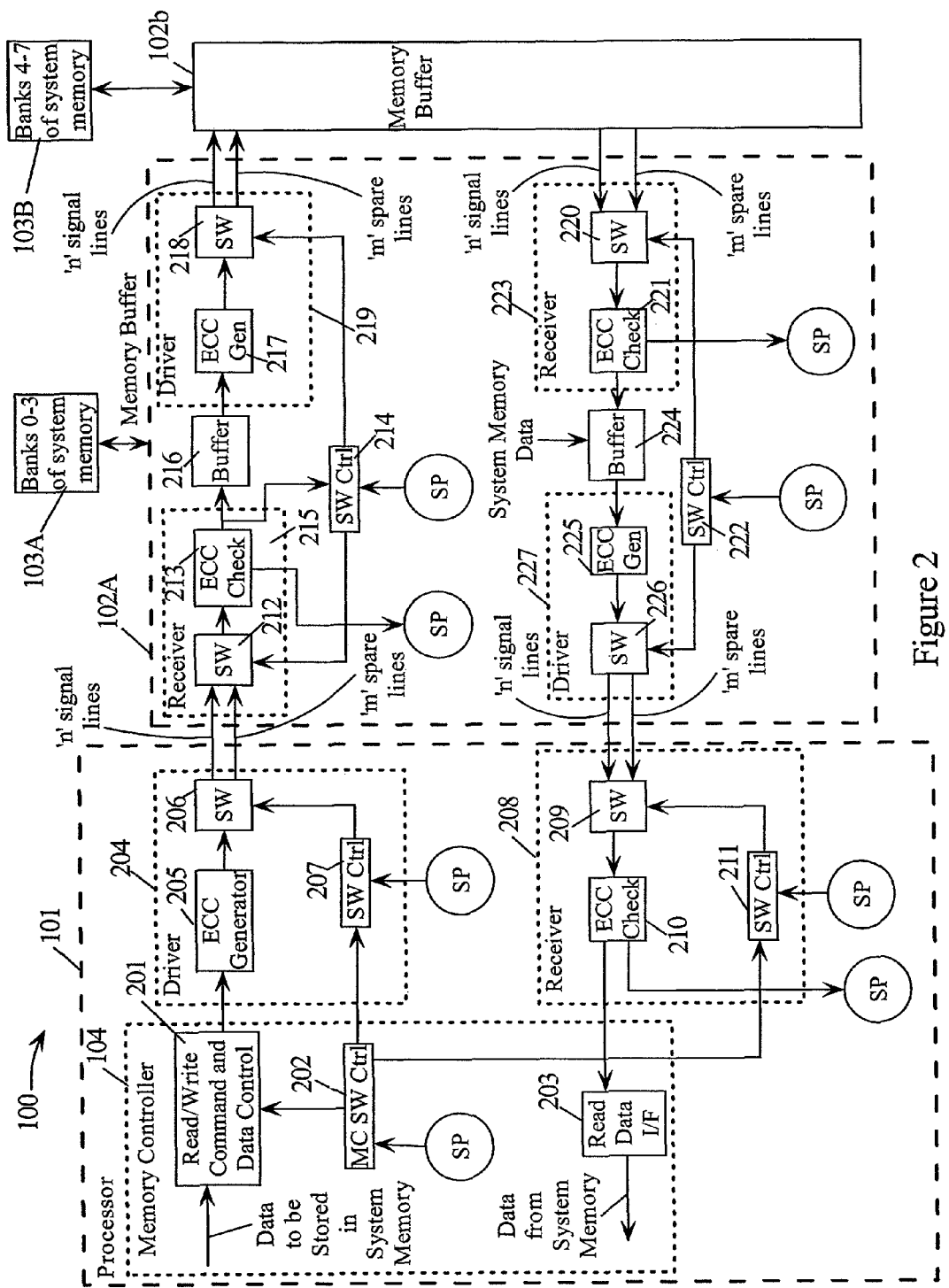
FIG. 2 illustrates a detailed section of the system of FIG. 1 in accordance with an embodiment of the present invention.
Figure 3:
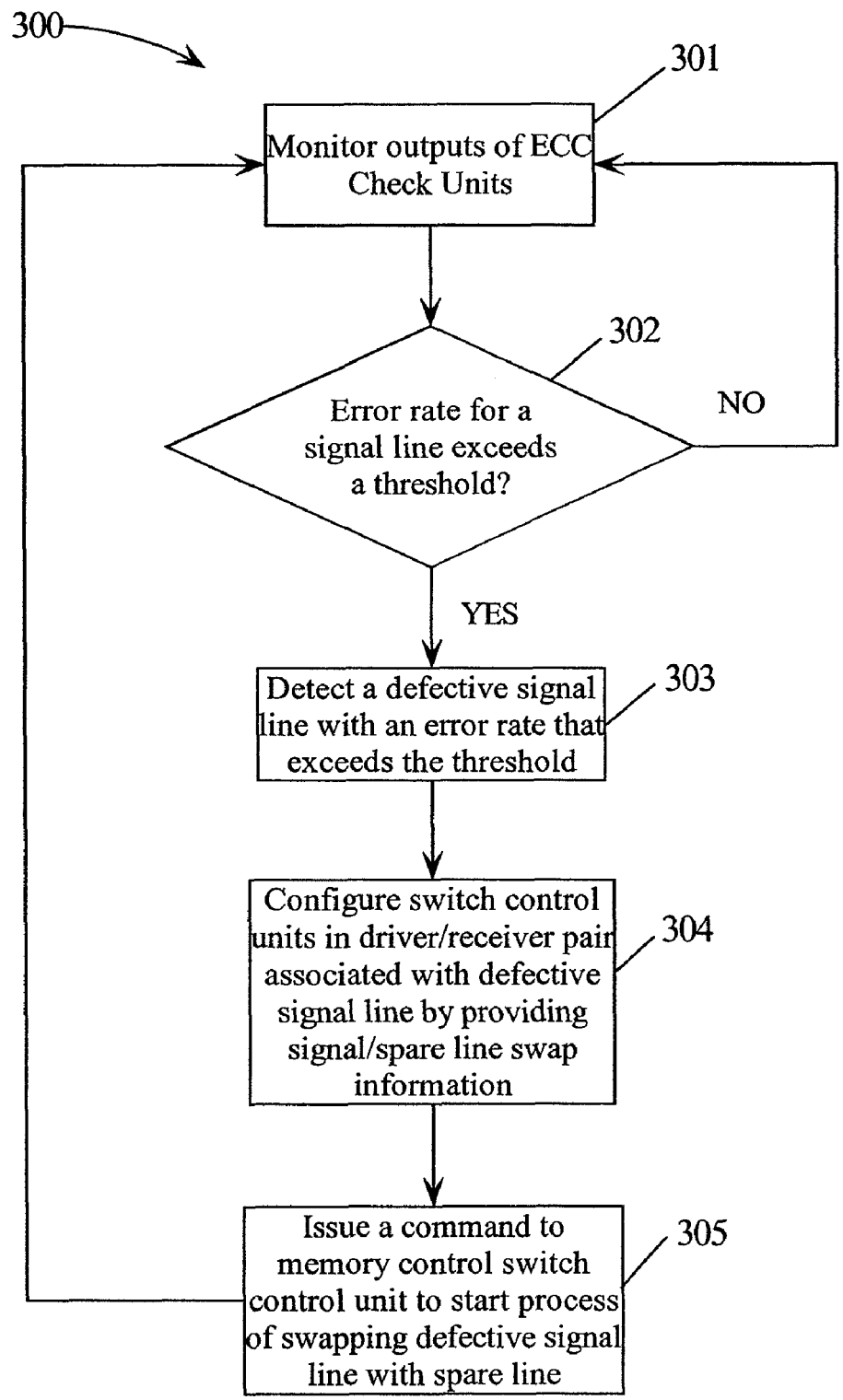
FIG. 3 is a flowchart of the process that service processor performs in switching a defective signal line with a spare signal line without shutting down the system in accordance with an embodiment of the present invention.
Figure 4:
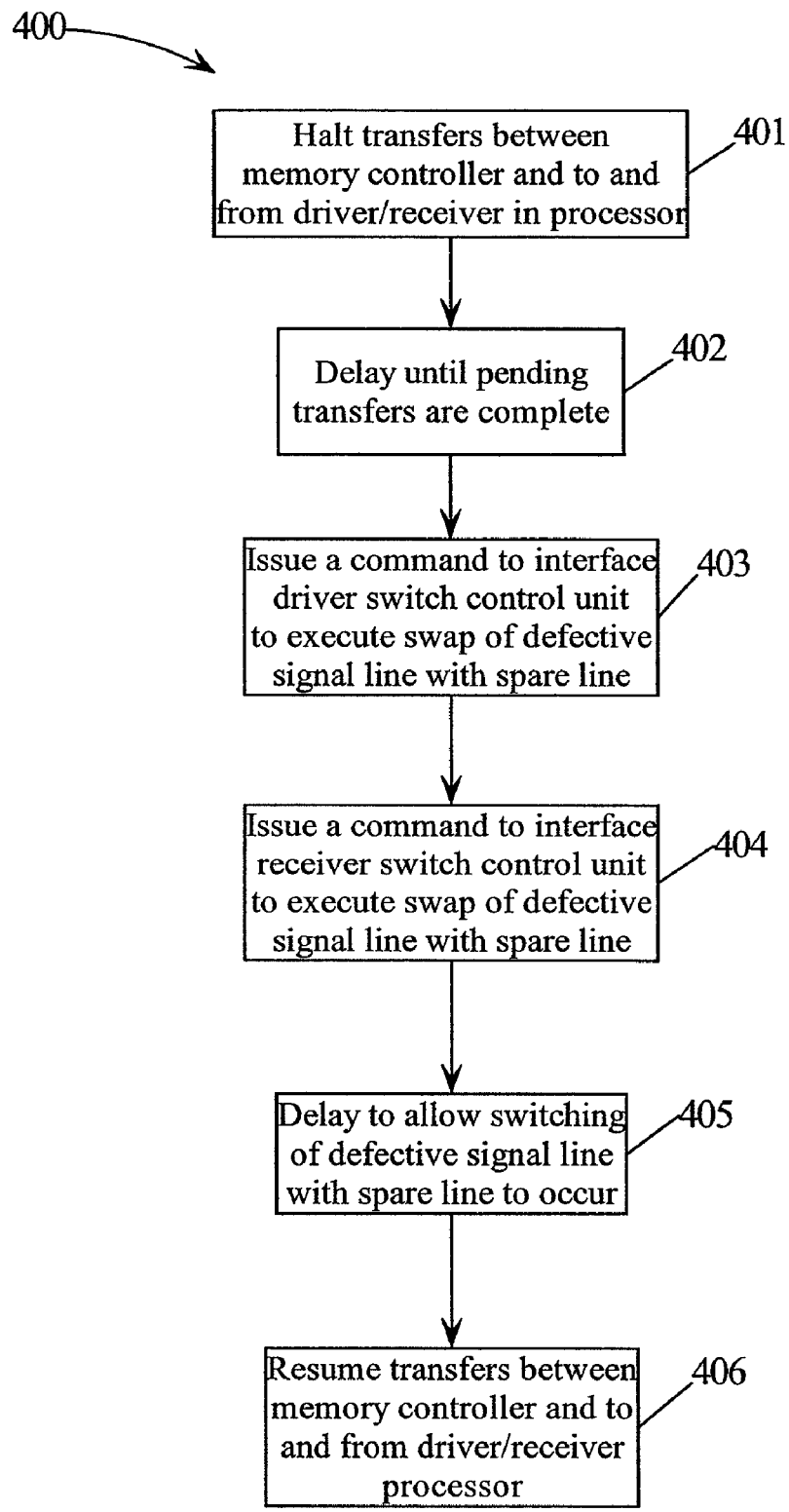
FIG. 4 is a flowchart of the process that memory controller performs in switching a defective signal line with a spare signal line without shutting down the system in accordance with an embodiment of the present invention.

FIG. 2 is a more detail description of a section of system 100 illustrating the switching of a defective signal line with a spare signal line without shutting down system 100. FIG. 3 is a flowchart of the process service processor 106 performs in switching a defective signal line with a spare signal line without shutting down system 100. FIG. 4 is a flowchart of the process memory controller 104 performs in switching a defective signal line with a spare signal line without shutting down system 100.

Referring to FIG. 1, service processor 106 may comprise a processor 107 coupled to various other components by a bus 108. An operating system 109 may run on processor 107 and provide control as well as coordinate the function of the various components of FIG. 1. An application 110 in accordance with the principles of the present invention may run in conjunction with operating system 109 and provide output calls to operating system 109 where the output calls implement the various functions or services to be performed by application 110. Application 110 may include for example, a program for monitoring for a defective signal line and issuing a command to memory controller 104 to start the process in switching the defective signal line with a designated spare line as described further below in association with FIG. 3.

Referring to FIG. 1, read only memory (ROM) 111 may be coupled to bus 108 and include a Basic Input/Output System ("BIOS") that controls certain basic functions of service processor 106. Random access memory (RAM) 112, disk adapter 113, and communications adapter 114 may also be coupled to bus 108. It should be noted that software components including operating system 109 and application 110 may be loaded into RAM 112 which may be service processor's 106 main memory. Disk adapter 113 may be an integrated drive electronics ("IDE") adapter that communicates with disk unit 115, e.g., disk drive. It is noted that the program of the present invention that monitors for a defective signal line and issues a command to memory controller 104 to start the process in switching the defective signal line with a designated spare line, as described in association with FIG. 3, may reside in disk unit 115 or in application 110. Communications adapter 114 may interconnect bus 108 with a bus (not shown) in system 100 enabling service processor 106 to monitor processor 101 and memory buffers 102 as well to communicate with memory controller 104 to start the process in switching the defective signal line with a designated spare line.

Implementations of the invention include implementations as a computer system programmed to execute the method or methods described herein, and as a computer program product. According to the computer system implementation, sets of instructions for executing the method or methods are resident in the random access memory 112 of one or more computer systems configured generally as described above. Until required by service processor 106, the set of instructions may be stored as a computer program product in another computer memory, for example, in disk drive 115 (which may include a removable memory such as an optical disk or floppy disk for eventual use in the disk drive 115). Further, the computer program product may also be stored at another computer and transmitted when desired to the user's workstation by a network or by an external network such as the Internet. One skilled in the art would appreciate that the physical storage of the sets of instructions physically changes the medium upon which it is stored so that the medium carries computer readable information. The change may be electrical, magnetic, chemical, biological, or some other physical change.

It is noted that the steps performed by the program of the present invention that monitors for a defective signal line and issues a command to memory controller 104 to start the process in switching the defective signal line with a designated spare line, as described in association with FIG. 3, may be implemented by a hardware state machine.

In one embodiment, service processor 106 is embodied on a separate integrated circuit within system 100. In one embodiment, processor 101, memory buffers 102 and sets of banks 103 may reside on a separate integrated circuit within system 100. It is noted that FIG. 1 is illustrative and that not all of the components of system 100 were depicted for the sake of brevity. It is further noted that system 100 is not to be limited in scope to the system disclosed.

As stated in the Background Information section, traditionally, when a signal line is detected as being defective, the defective signal line is replaced with the spare line by deactivating, i.e., turning off, the computer system. Once the computer system is deactivated, the defective signal line is replaced with the spare signal line. However, by requiring to deactivate the computer system, a significant amount of time (time that the computer system is deactivated plus the time to replace the defective signal line with the spare signal line plus the time to reactivate the computer system) elapses before data can be resent from the processor to the memory buffers. If the computer system did not have to be deactivated in order to switch the defective signal line with the spare signal line, then the time that the processor could not send information to the memory buffers would be greatly reduced. Therefore, there is a need in the art to switch a defective signal line with a spare signal line without shutting down the computer system. The defective signal line is switched with a spare signal line without shutting system 100 as described below in association with FIG. 2. FIG. 2 is a detailed section of system 100 illustrating how a defective signal line is switched with a spare signal line without shutting system 100.

FIG. 2—Portion of the System of FIG. 1 Illustrating the Switching of a Defective Signal Line with a Spare Signal Line without Shutting Down the System FIG. 2 illustrates a detailed portion of system 100 (FIG. 1) illustrating the switching of a defective signal line with a spare signal line without shutting down system 100 in accordance with an embodiment of the present invention.

Referring to FIG. 2, processor 101 includes memory controller 104. Memory controller 104 may include a read/write command and data control unit 201 configured to control the issuance of read/write commands as well as any data associated with those commands. Data control unit 201 may also be configured to receive the data to be stored in system memory (not shown). Memory controller 104 may further include a memory controller switch control unit ("MC SW CTRL") 202. Memory controller switch control unit 202 may be configured to determine the timing in the issuance of the read/write commands and associated data. Memory controller switch control unit 202 may further be configured to initiate the process in switching the defective signal line with the spare line as described in further detail below. Memory controller 104 may further include a read data interface unit 203 configured to read data from system memory (not shown).

As illustrated in FIG. 1, processor 101 may include a driver/receiver 105. As illustrated in FIG. 2, driver/receiver 105 may include a driver 204 that includes an error correction code (ECC) generator 205 coupled to a switch ("SW") 206 along with a switch control unit ("SW CTRL") 207. ECC generator 205 may be configured to generate an error correction code to be inserted in a field in the incoming data. The output of ECC generator 205 (received data plus the field containing the error correction code) may be transmitted to switch 206 configured to select which of the "n" signal lines to transmit the data with the generated error correction code to the receiver in memory buffer 102A. Switch control unit 207 is coupled to memory controller switch control unit 202 and to switch 206. Switch control unit 207 may be configured to control switch 206. For example, switch control unit 207 may be configured to command switch 206 to transmit data to a particular signal line. In another example, switch control unit 207 may be configured to command switch 206 to switch a defective signal line with a designated spare line.

Driver/receiver 105 (FIG. 1) may include a receiver 208 that includes a switch 209 coupled to an ECC check unit 210. Receiver 208 may further include a switch control unit 211 configured similarly to switch control unit 207. Switch 209 may be configured to receive data transmitted over a signal line. The transmitted data, which includes an error correction code field as discussed above, may be inputted to an ECC check unit 210 configured to output what is referred to herein as a "syndrome field." The syndrome field indicates whether the signal line is in error. ECC check unit 210 further outputs the data received by receiver 208 to read data interface 203. As stated above, switch control unit 211 is configured similarly as switch control unit 207. Switch control unit 211 is coupled to switch 209 and to memory controller switch control unit 202.

Each memory buffer 102 includes multiple driver/receiver pairs configured similarly as driver 204 and receiver 208 in processor 101. For example, memory buffer 102A may include a switch 212 configured similarly as switch 209. Switch 212 is coupled to ECC check unit 213 configured similarly as error correction code check unit 210 except that its output is inputted to a buffer and to a switch control unit as described below. Switch 212 and ECC check unit 213 may be coupled to switch control unit 214 configured similarly as switch control unit 211. Switch 212 and ECC check unit 213 may be said to form a receiver 215 of memory buffer 102A. Switch control unit 211 may also be said to form part of receiver 215 of memory buffer 102A.

ECC check unit 213 may be coupled to a buffer 216 configured to store the read/write commands or data to be written to system memory. The data stored in buffer 216 may be forwarded to ECC generator 217 configured similarly as ECC generator 205. The output of ECC generator 217, which includes the received data plus an error correction code field to store the error correction code generated by ECC generator 217, is inputted to switch 218. Switch 218, configured similarly as switch 206, selects one of the n signal lines to output the received data (including the error correction code field) received from ECC generator 217. This data is outputted to the next chained memory buffer 102, e.g., memory buffer 102B. ECC generator 217 and switch 218 may be said to form a driver 219 of memory buffer 102A. Switch control unit 214 may also be said to form part of driver 219 of memory buffer 102A.

Each memory buffer 102, such as memory buffer 102A, may further include a second driver/receiver pair, such as described above (driver 219/receiver 215), except that the receiver is on the right side and the driver is on the left side. For example, referring to the bottom portion of memory buffer 102A, data transmitted from memory buffer 102B may be received on one of the "n" signal lines by switch 220, configured similarly as switch 212. The output of switch 220 may be transmitted to ECC check unit 221, configured similarly as error correction code check unit 213. Switch 220 may be coupled to a switch control unit 222 configured similarly as switch control unit 214. Switch 220 and ECC check unit 221 may be said to form a receiver 223 in the bottom portion of memory buffer 102A. Switch control unit 222 may also be said to form part of receiver 223 in the bottom portion of memory buffer 102A.

Memory buffer 102A may further include a buffer 224 configured similarly as buffer 216. Buffer 224 may be configured to store data from system memory (not shown) that will be transmitted to processor 101. Memory buffer 102A may further include an ECC generator 225 configured similarly as ECC generator 217. ECC generator 225 may be coupled to a switch 226 configured similarly as switch 218. Switch 226 may be coupled to switch control unit 222. Switch 226 and ECC generator 225 may be said to form a driver 227 in the bottom portion of memory buffer 102A. Switch control unit 222 may also be said to form part of driver 227 in the bottom portion of memory buffer 102A.

Each memory buffer 102 may be configured similarly as memory buffer 102A described above. Further, as stated above, each memory buffer 102 is coupled to one another via "n" signal lines and "m" spare lines. When one of the "n" signal lines becomes defective, it is replaced with one of the "m" spare lines using the process described below in association with FIGS. 3-4. The process in replacing the defective signal line with a spare line involves service processor 106 monitoring error correction code check units, such as error correction code check units 210, 213, 221, as illustrated in FIG. 2 (arrow pointing to SP 106 from error correction code check units 210, 213, 221). Further, the process in replacing the defective signal line with a spare line involves service processor 106 configuring switch control units, such as switch control units 207, 211, 214, 222, as illustrated in FIG. 2 (arrow pointing to switch control units 207, 211, 214, 222 from SP 106). Further, the process in replacing the defective signal line with a spare line involves service processor 106 issuing a command to memory controller switch control unit 202 to start the process in swapping a defective signal line with a designated spare line as illustrated in FIG. 2 (arrow pointing to memory controller switch control unit 202 from SP 106). The process in switching a defective signal line with a designated spare line using service processor 106 will be described further below in association with FIG. 3.

Further, the process in replacing the defective signal line with a spare line involves memory controller switch control unit 202 issuing a command to particular switch control units, such as switch control units 207, 211, 214, 222, to execute the switch of a defective signal line with a spare signal line. It is noted that memory controller switch control unit 202 issues a command to switch control units in memory buffers 102 via ECC check units, such as ECC check unit 213. The ECC check units in memory buffers 102, such as ECC check unit 213, may be configured to determine if memory controller switch control unit 202 issued a command to the switch control unit coupled to ECC check unit. For example, memory controller switch control unit 202 would issue a command to switch control unit 214 by inserting the command in data sent to ECC generator 205. This command would be received by ECC check unit 213 via switches 206, 212. ECC check unit 213 would then be configured to read the data to see if there is a command to be sent to switch control unit 214. If so, then ECC check unit 213 would forward the received command to switch control unit 214.

It is noted that when the term "ECC check unit" is referred to herein without designating a reference numeral, the term "ECC check unit" refers to any ECC check unit in processor 101 or memory buffer 102, such as ECC check unit 210, 213, 221. It is further noted that when the term "switch control unit" is referred to herein without designating a reference numeral, the term "switch control unit" refers to any switch control unit in processor 101 or memory buffer 102, such as switch control unit 207, 211, 214, 222.

FIG. 3—Method for Monitoring for a Defective Signal Line and Issuing a Command to a Memory Controller to Start the Process in Switching the Defective Signal Line with a Designated Spare Line FIG. 3 is a flowchart of a method 300 for monitoring for a defective signal line and issuing a command to memory controller 104 (FIGS. 1-2) to start the process in switching the defective signal line with a designated spare line by service processor 106 (FIG. 1).

Referring to FIG. 3, in conjunction with FIGS. 1-2, in step 301, service processor 106 monitors the outputs of ECC check units, such as ECC check units 210, 213, 221, for an error in a signal line checked by ECC check unit. As stated above, ECC check units, such as ECC check units 210, 213, 221, output a syndrome field indicating whether the signal line (one of the "n" signal lines where data was transmitted) checked by the ECC check unit is in error.

In step 302, service processor 106 determines whether an error rate detected by an ECC check unit, such as ECC check units 210, 213, 221, exceeds a threshold. Service processor 106 performs step 302 for each ECC check unit thereby determining whether any of the signal lines between memory buffers 102 amongst themselves or between processor 101 and memory buffer 102A is defective.

If service processor 106 detected an error rate for a signal line that exceeded a threshold, then service processor 106 detected a defective signal line whose error rate exceeded the threshold in step 303. For example, if ECC check unit 213 detected an error in signal line #1 (referring to one of the "n" signal lines coupling switch 206 with switch 212) ten times during a predefined period of time and the threshold is detecting an error nine times during the same predefined period of time, then signal line #1 is defective and needs to switched with one of the "m" spare lines coupling switch 206 with switch 212. An example of a defective signal line may include a signal line that has a short, has an open connection or is a bad DIMM connector.

In step 304, service processor 106 configures switch control units, such as switch control units 207, 211, 214, 222, in the driver/receiver pair associated with the defective signal line by providing signal/spare line swap information. That is, service processor 106 configures the interface driver/receiver switch control units associated with the defective signal line to execute a switch of the indicated defective signal line with a designated spare line. For example, suppose signal line #1 between switch 206 (located in driver 204 of processor 101) and switch 212 (located in receiver 215 of memory buffer 102A) was determined to be defective. Service processor 106 informs switch control units 207, 214 (switch control unit 207 located in driver 204 of processor 101 and switch control unit 214 may be said to located in receiver 215 of memory buffer 102A) that signal line #1 needs to be switched with spare line #1 (one of the m spare line between switch 206 and switch 212).

In step 305, service processor 106 issues a command to memory controller switch control unit 202 to start the process of switching the defective signal line with a spare line. The process of switching the defective signal line with a spare line is discussed below in association with FIG. 4.

Referring to step 302, if, however, the error rate for a signal line does not exceed a threshold, then, in step 301, service processor 106 continues to monitor the outputs of ECC check units, such as ECC check units 210, 213, 221, for an error in a signal line checked by the ECC check unit.

It is noted that method 300 may include other and/or additional steps that, for clarity and brevity, are not depicted. It is further noted that method 300 may be executed in a different order presented and that the order presented in the discussion of FIG. 3 is illustrative. It is further noted that certain steps in method 300 may be executed in a substantially simultaneous manner.

FIG. 4—Method for Performing a Switch of the Defective Signal Line with a Spare Line without Shutting Down the System Involving Memory Controller Switch Control Unit FIG. 4 is flowchart of a method 400 for performing a switch of the defective signal line with a spare line without shutting down system 100 (FIGS. 1 and 2) involving memory controller switch control unit 202 (FIG. 2).

Referring to FIG. 4, in conjunction with FIGS. 1-3, in step 401, memory controller switch control unit 202, upon receiving the command to start the process of swapping the defective signal line with a spare line in step 305, halts the transfers between memory controller 104 and to and from driver 204/receiver 208 in processor 101. Transfers may refer to the issuance of read or write commands, data to be written to the system memory, data read from the system memory, etc.

In step 402, a delay is implemented to allow the pending transfers described above to complete.

In step 403, memory controller switch control unit 202 issues a command to interface driver switch control unit, e.g., switch control unit 207, to execute the switch of the defective signal line with a spare line. For example, suppose service professor 106 informed switch control units 207, 214 that signal line #1 (one of the n signal lines between switch 206 and switch 212) needs to be switched with spare line #1 (one of the m spare line between switch 206 and switch 212) in step 304. Memory controller switch control unit 202 may inform switch control unit 207 in driver 104 of processor 101, which controls switch 206, to execute the switch of defective signal #1 with spare line #1.

In step 404, memory controller switch control unit 202 issues a command to interface receiver switch control unit, e.g., switch control unit 207, to execute the switch of the defective signal line with a spare line. Referring to the above example, memory controller switch control unit 202 may further inform switch control unit 214 in what may be said to be receiver 215 of memory buffer 102A to execute the switch of defective signal #1 with spare line #1.

In step 405, a delay is implemented to allow the switching of the defective signal with the spare line.

In step 406, memory controller switch control unit 202 resumes the transfers, as described above, between memory controller 104 and to and from driver 204/receiver 208 in processor 101.

It is noted that method 400 may include other and/or additional steps that, for clarity and brevity, are not depicted. It is further noted that method 400 may be executed in a different order presented and that the order presented in the discussion of FIG. 4 is illustrative. It is further noted that certain steps in method 400 may be executed in a substantially simultaneous manner.

Although the method, computer program product and system are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

The invention claimed is:

1. A method for switching a defective signal line with a spare signal line without shutting down a computer system comprising the steps of:
    monitoring outputs of units configured to determine if a signal line is in error, said units being located in memory buffers coupled to particular banks of system memory and in a processor coupled to said memory buffers;
    detecting a defective signal line if said defective signal line has an error rate that exceeds a threshold; and
    configuring switch control units in a driver/receiver pair associated with said defective signal line to execute a switch of said defective signal line with an indicated spare signal line, wherein said switch control units are configured to control switch units configured to determine which signal line to transmit and receive incoming data.

2. The method as recited in claim 1 further comprising the step of:
    issuing a command to a memory controller switch control unit to initiate a process of switching said defective signal line with said spare line, wherein said memory controller switch control unit is configured to determine a timing in an issuance of read/write commands from a processor.

3. The method as recited in claim 1 further comprising the step of:
    halting transfers between a memory controller and to and from a driver/receiver, respectively, in a processor.

4. The method as recited in claim 3 further comprising the steps of:
    issuing a first command to an interface driver switch control unit associated with said defective signal line to execute a switch of said defective signal line with said spare line; and
    issuing a second command to an interface receiver switch control unit associated with said defective signal line to execute a switch of said defective signal line with said spare line.

5. The method as recited in claim 4 further comprising the steps of:
    resuming transfers between said memory controller and to and from said driver/receiver, respectively, in said processor after a delay to allow switching of said defective signal line with said spare signal line to occur.

6. The method as recited in claim 1, wherein said incoming data comprises at least one of the following: a read command, a write command and data to be written in said system memory.

7. A computer program product embodied in a machine readable medium for switching a defective signal line with a spare signal line without shutting down a computer system comprising the programming steps of:
    monitoring outputs of units configured to determine if a signal line is in error, said units being located in memory buffers coupled to particular banks of system memory and in a processor coupled to said memory buffers;
    detecting a defective signal line if said defective signal line has an error rate that exceeds a threshold; and
    configuring switch control units in a driver/receiver pair associated with said defective signal to execute a switch of said defective signal line with an indicated spare signal line, wherein said switch control units are configured to control switch units configured to determine which signal line to transmit and receive incoming data.

8. The computer program product as recited in claim 7 further comprising the programming step of:
    issuing a command to a memory controller switch control unit to initiate a process of switching said defective signal line with said spare line, wherein said memory controller switch control unit is configured to determine a timing in an issuance of read/write commands from a processor.

9. The computer program product as recited in claim 7, wherein said incoming data comprises at least one of the following: a read command, a write command and data to be written in said system memory.

* * * * *